United States Patent [19]

Doyle

[11] Patent Number: 4,646,427

[45] Date of Patent: Mar. 3, 1987

[54] METHOD OF ELECTRICALLY ADJUSTING THE ZENER KNEE OF A LATERAL POLYSILICON ZENER DIODE

[75] Inventor: James T. Doyle, Coral Springs, Fla.

[73] Assignee: Motorola, Inc., Schaumburg, Ill.

[21] Appl. No.: 625,751

[22] Filed: Jun. 28, 1984

[51] Int. Cl.[4] .......................................... H01L 21/326
[52] U.S. Cl. ...................................... 29/586; 29/584;
148/183; 148/DIG. 13; 148/DIG. 18;
148/DIG. 55; 148/DIG. 122; 148/DIG. 154;
148/DIG. 174; 357/13; 357/59; 365/105
[58] Field of Search ................................. 29/584–586;
148/183; 357/59, 13; 365/105

[56] References Cited

U.S. PATENT DOCUMENTS

| | | |
|---|---|---|
| 3,206,340 | 9/1965 | Stelmak .............................. 148/183 |
| 3,380,902 | 4/1968 | Weiss ................................... 148/183 |
| 3,626,389 | 12/1971 | Waaben ............................... 365/175 |
| 3,667,116 | 6/1972 | Di Felice ............................... 29/584 |
| 3,701,119 | 10/1972 | Waaben et al. ..................... 365/175 |
| 3,739,356 | 6/1973 | Pricer .................................. 365/175 |
| 3,742,592 | 7/1973 | Rizzi et al. ........................... 29/584 |
| 3,792,319 | 2/1974 | Tsang ................................... 365/96 |
| 3,796,931 | 3/1974 | Maute .................................. 357/2 |
| 3,810,127 | 5/1974 | Hoff, Jr. ............................... 365/96 |
| 3,810,128 | 5/1984 | Moser ................................. 357/15 |
| 3,909,805 | 9/1975 | Touron et al. ..................... 365/105 |
| 3,916,392 | 10/1975 | Richardson ........................ 365/175 |
| 4,028,563 | 6/1977 | Geisler ................................ 357/13 |
| 4,070,654 | 1/1978 | Tachi .................................. 357/15 |
| 4,145,702 | 3/1979 | Rau, III et al. ...................... 365/45 |
| 4,146,902 | 3/1979 | Tanimoto et al. .................... 357/59 |
| 4,229,757 | 10/1980 | Moussie .............................. 357/59 |
| 4,287,569 | 9/1981 | Fukushima ......................... 365/96 |
| 4,399,372 | 9/1983 | Tanimoto et al. .................... 357/59 |
| 4,420,766 | 12/1983 | Kasten ................................. 357/59 |
| 4,480,318 | 10/1984 | Chong ................................ 365/105 |
| 4,534,100 | 8/1985 | Lane ................................... 148/183 |

Primary Examiner—William D. Larkins
Attorney, Agent, or Firm—Mark P. Kahler; Joseph T. Downey; Anthony J. Sarli, Jr.

[57] ABSTRACT

In a method of electrically altering the characteristics of a semiconductor device, a lateral polysilicon zener diode's zener knee voltage may be shifted either to a higher or lower voltage. An electrical potential may be applied in the forward direction to shift the zener knee to a higher voltage level. An electrical potential may be applied in the reverse bias direction to shift the zener knee to a lower voltage. In the limit, the zener may be changed into a forward diode of reverse polarity with respect to the original zener. The electrical potential used should be of appropriate magnitude to melt the polysilicon without damage to the zener's terminals. This induces migration of the impurities causing a rediffusion of impurities thereby altering the characteristics of the diode. This method may be used to program a PROM by either converting the zener to a diode or not to program each binary bit. The device may also be used as an analog memory element by setting an entire word equal to a predetermined zener knee voltage.

7 Claims, 7 Drawing Figures

METHOD OF ELECTRICALLY ADJUSTING THE ZENER KNEE OF A LATERAL POLYSILICON ZENER DIODE

BACKGROUND

1. Field of the Invention

This invention relates to the fields of electrically alterable circuit elements, semiconductors, and electrical memory devices. More particularly this invention relates to a technique for electrically changing the properties of a lateral polycrystalline silicon (polysilicon) zener diode. This process renders the device particularly useful as an analog or digital electrical memory element.

2. Background of the Invention

Polysilicon diodes and resistors as well as nichrome links and other devices have been used as fusable links for PROMs (Programmable Read Only Memory) in the recent past by injecting large currents into the devices to create open or short circuits (primarily by altering the contact metalization of the device). This type of programming often results in structural damage to the devices or substrate because of the physical stresses induced by the programming process. Also, contamination of the integrated circuit can take place as a result of structural damage to the metalization and surrounding structures and ruptures may occur due to venting of gasses as a result of the high temperatures created in the programming process. These factors ultimately degrade the reliability of the PROM resulting in premature failure of the electronic device utilizing the PROM.

It is also possible to convert vertical zener diode structures to resistors for use as a memory element by injecting large currents thereby causing the contact metalization to diffuse through the diode structure. This is commonly known as "zener zapping" and causes many of the same reliability problems mentioned above.

In addition to these problems, none of the known link blowing processes are reversible and many of the known structures require highly specialized integrated circuit processing steps thereby radically increasing the cost. Furthermore, none of the known structures and processes lend themselves to use as a non-volatile analog memory element due to the completely binary nature of the programability. Analog memory elements may by their very nature store many bits of information as for example a single voltage level and greatly increases the information density possible in a single memory device. Binary memory elements are only capable of storing a single binary digit (bit) per memory element.

SUMMARY OF THE INVENTION

It is therefore an object of the present invention to provide a high reliability circuit element which may be used as a memory element in a PROM.

It is another object of the present invention to provide a reversible process for programming a PROM link with a near infinite non-volitile storage lifetime.

It is another object of the present invention to provide a method of electrically converting a zener diode into a reversed diode.

It is another object of the present invention to provide a PROM programming method which uses low programming currents.

It is another ob3ect of the present invention to provide a PROM memory device which may be programmed with either constant current or constant voltage programming techniques.

It is another object of the present invention to provide an analog memory element which is programmable to an arbitrary voltage level.

It is another object of the present invention to provide a method of programming an analog memory element.

It is a further object of the present invention to provide a low cost memory element which may be produced in standard integrated circuit processing flows such as Silicon Gate CMOS or equivalent processes.

These and other objects of the present invention will become apparent to those skilled in the art upon consideration of the following description of the invention.

In one embodiment of the present invention, a method is provided for electrically altering the characteristics of a semiconductor device. Preferrably the semiconductor device includes a P+type region made of intrinsic material doped with P+type impurities and an N+type region made up of intrinsic material doped with an N+type impurity forming a relatively narrow grain boundry P+/N+junction having a zener knee voltage associated therewith. The P type region is coupled to a first terminal and the N type region is coupled to a second terminal and at least one of the regions is made of a polycrystalline silicon material or equivalent. The method includes the step of applying an electrical potential across the P+/N+junction wherein the electrical potential is suitable for inducing migration of the P+ and N+type impurities thereby altering the geometry, doping profile and makeup of the P/N junction causing a change in the zener knee voltage. The electrical potential is of a magnitude lower than that required to melt or otherwise significantly alter the terminals. A forward bias electrical potential is used to increase the zener knee and a reverse bias potential is used to decrease the zener knee voltage. The exact characteristics of the electrical potential are dependant upon the desired effect and the geometry and processing parameters of the semiconductor device.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DETAILED DESCRIPTION OF THE PREFERRED EMBODIMENT

Figure 1:
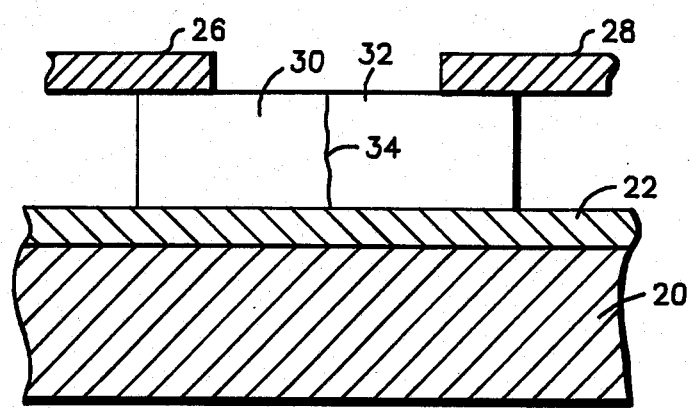
FIG. 1 shows a cross section of a lateral polysilicon zener diode suitable for use in the present invention.

Turning now to FIG. 1, a lateral polysilicon zener diode structure suitable for use in conjunction with the present method is shown in cross section. The lateral structure is desirable in the present embodiment because of the decreased junction size possible with a lateral structure due to layout restrictions. This lateral structure is particularly well adapted to use in conjunction with many standard CMOS Silicon Gate manufacturing processes. In the preferred embodiment, an N- silicon substrate 20 is used and should be electrically coupled to the most positive voltage connected to the integrated circuit to insure proper device isolation. It is of course understood that the present circuit element is likely to be included on a substrate along with many other circuit elements to form an integrated circuit. A silicon-dioxide layer 20 covers the surface of the substrate 22 as is well known in the art.

A lateral polysilicon zener diode 24 is provided on the surface of oxide layer 22 and has first and second metal terminations 26 and 28 respectively. In the preferred embodiment, diode 24 is a lateral N+/P+polysilicon diode but it may be possible to utilize other structures as well. Diode 24 is preferrably formed by starting with a layer of intrinsic polysilicon deposited using low pressure deposition at approximately 625 degrees Celcius. A P+region 30 is formed by implanting a $6 \times 10^{15}/cm^2$ doping of Boron. The implanted charge is equivalent to approximately $6 \times 10^{15}/cm^2$ implanted at approximately 50 KEV. The resulting profile is substantially redistributed to a uniform doping profile. The surface doping profile is approximately $N_A = 4 \times 10^{19}/cm^3$ of active Boron with a sheet resistivity of about 2.0 ohm-cm.

An N+region 32 is created using a doping charge of $9 \times 10^{15}/cm^2$ of Phosphorous at 125 KEV and the doping profile is totally redistributed. The surface concentration is approximately $N_D = 3 \times 10^{19}/cm^3$ of active phosphorous with a sheet Rho of approximately 2.0 ohm-cm.

An annealling and curing step of 30 minutes at about 1000 degrees Celcius in Nitrogen is utilized. The resulting polysilicon diode is approximately 5000 Angstroms thick. In the preferred embodiment, the diode 24 is approximately 20 microns wide and approximately 80 microns long but this is not to be limiting. It is however preferrable that the device geometries be small so that programming currents are minimized, damage to terminations is eliminated and circuit density is maximized as will be discussed later. Due to the polycrystalline structure of the polysilicon, a grain boundry P/N junction 34 is formed and the resulting zener diode has a 1 microamp zener knee of nominally 6.0 volts but can vary substantially. The breakdown voltage of devices made with this process is approximately 20 volts.

Metal terminations 26 and 28 are preferrably made of aluminum alloy such as 95% aluminum and 5% silicon with an alloy depth of approximately 0.1 um. The Aluminum alloy is eutecticly bonded to the polysilicon and has a melting temperature of about 523 degrees Celcius. Termination 26 is utilized to electrically access the zener diode's anode while termination 28 is utilized to access the cathode.

Figure 2:
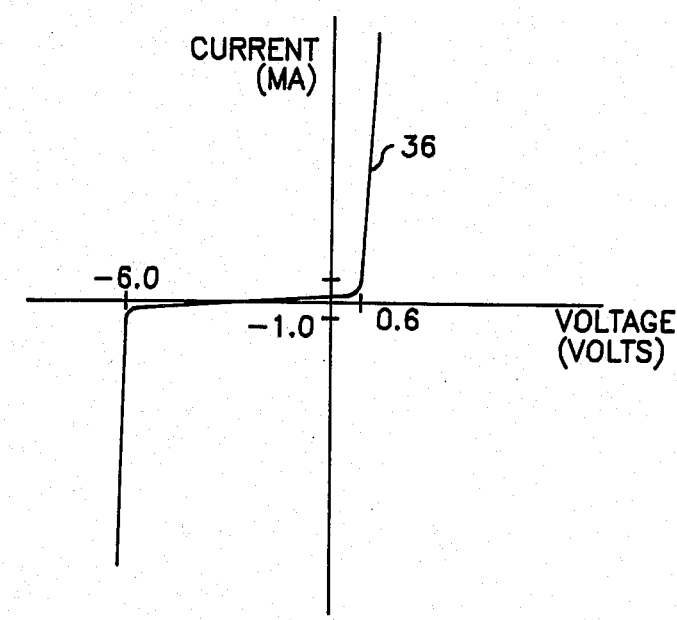
FIG. 2 shows a graph of the transfer characteristics of a sample of a diode constructed according to FIG. 1.

The structure of FIG. 1 yields a zener diode exhibiting typical zener diode characteristics such as those of curve 36 of FIG. 2. The zener knee voltage is nominally about 6.0 volts at 1.0 microamps prior to electrical adjustment by the methods of the present invention.

By utilizing the methods of the present invention, the voltage at which the zener knee occurs may be adjusted either up or down. By applying an appropriate forward current, the knee may be shifted up to near and in fact beyond the crystalline silicon device breakdown voltage (approximately 20 volts in this embodiment). In many instances, zener knees as high as approximately 30 volts have been obtained. Application of an appropriate reverse current results in the zener knee being shifted downward. In the limit the zener may be converted into a forward biased diode with anode and cathode reversed from those of the original zener. That is, the anode of the programmed diode is coupled to termination 28 and the cathode is coupled to termination 26. One skilled in the art will readily recognize that this may be utilized effectively as a mechanism for programming a PROM.

In order to more fully understand the programming process involved in the present invention it is helpful to examine the chain of events involved in programming the diode using a positive voltage ramp. The characteristics of this programming process are shown in curve 38 of FIG. 3. It should be clear, however, that this is not the only method of electrically programming the present diode, but merely a convenient method for examining the phenomenon associated therewith.

It will also be clear to those skilled in the art that the particulars of the programming voltages, currents and times are heavily dependent upon the device geometries as well as the processing parameters. When any of these factors are adjusted, suitable modification of the programming process may be required. In addition, particular modification of the device geometries may result in an unprogrammable diode. This is because all of the present programming takes place before damage to the terminations occurs. Some geometries may result in damage to the terminations or the device itself prior to completion of programming. Such is the case with more conventional zener programming methods.

Figure 3:
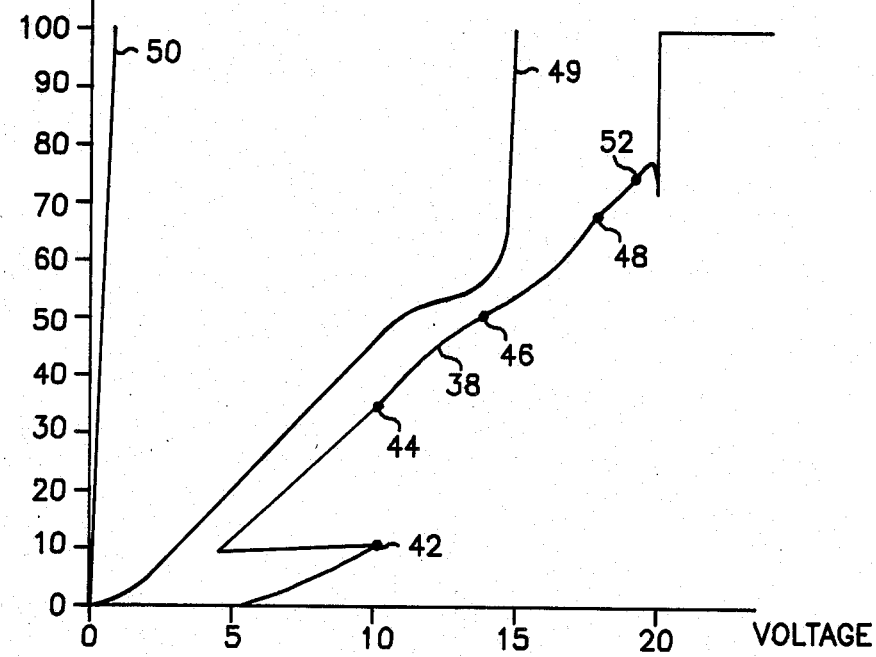
FIG. 3 is a graph of the programming characteristics of the sample diode of FIG. 1.

In carrying out this process, five distinct stages of heating activity appear. on the graph of FIG. 3 corresponding to five distinct physical phenomenon occuring during programming. The first stage is defined between points 40 and 42. This first stage corresponds to conventional zener diode operation. No change in the diode's characteristics take place during this stage. When viewed under magnification, a line of small light emitting sources appears across the diode along the P/N junction at about 6 volts due to the localized heating at the junction. The light emitting sources are the result of junctions and "hot spots" resulting from current crowding and generally give off significant amounts of infrared light.

As the voltage is increased, the zener breakdown region is encountered between points 42 and 44. In this second stage, negative resistance is encountered. This zener breakdown region could be utilized effectively in oscillator and FDNR filter circuits for example or for many other potential applications as will be clear to those skilled in the art. As the voltage is increased in this region, the small light emitting sources tend to converge into a single dull red glowing circle approximately 4 microns in diameter at the center of the diode.

Further voltage increase leads to the third stage between points 44 and 46. This stage typically begins at approximately 30 milliamps (it has been observed as low as approximately 25 milliamps) and is characterized by the glowing circle splitting into two glowing circles equally spaced along the diode junction. During this stage, the zener knee begins shifting downward in voltage.

The fourth stage occurs between points 46 and 48. In this stage the zener knee continues to shift downward until at approximately 60 to 65 milliamps the reverse biased zener takes on the characteristics of a forward biased diode. In this stage the two glowing circles converge back into one brightly glowing region which slowly elongates toward the anode termination 26.

The forward diode is characterized by approximately 1 Meg ohm of parallel resistance and approximately 200 ohms of series resistance. The forward transfer characteristics of this diode are shown in FIG. 3 as curve 49. The characteristics are typical of an ordinary P/N junction up to approximately 50 milliamps of forward current at which point the diode behaves as though there are parasitic zener diodes in parallel with the diode causing a sharp increase in the slope of the curve at approximately 15 volts. This effect is attributed to redistribution of carriers across the surface of the lateral diode forming a short during this period of transition.

If the voltage is further increased, a fifth stage of programming is encountered beyond point 48. In this stage, the metal terminations are sufficiently heated that the cathode metal ions begin flowing to the anode rapidly forming a bridging metal link which shorts out the diode with a resistance of approximately 5 to 10 ohms as characterized by curve 50 of FIG. 3. In this stage, two small glowing regions form at the corners of the metal contact on the cathode side of the diode. This begins to occur at approximately point 52 of curve 38. Soon a flash of light is seen shooting from the cathode to the anode as the metal link is formed. Of course, forming a metal link in this manner may result in some of the disadvantages of prior art PROM programming methods.

In a similar manner, the zener knee may be shifted to a higher voltage by applying a forward bias current to the diode. The diode begins to exhibit a shift in the zener knee when approximately 30 milliamps of forward current is applied and may be shifted out to approximately 30 volts for the diode geometries. Of course, one skilled in the art will recognize that these limits are a function of device geometries, and processing parameters which may be adjusted experimentally to achieve different results.

Figure 4:
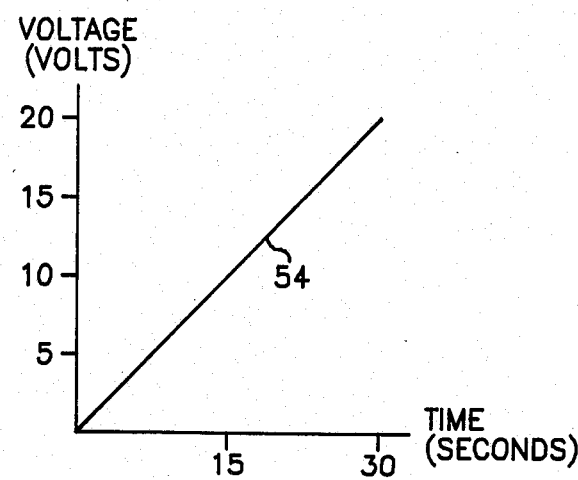
FIG. 4 is a graph of programming voltage versus time for the programming process graphed in FIG. 3.

It should be understood that the graphs of FIG. 3 are meant to be typical of the programming process for the diode structure of the preferred embodiment but significant variation from diode to diode can be expected. It should also be noted that the potential required to create a short circuit is very consistent at approximately 20 volts. The curves of FIG. 3 were generated by applying a slowly increasing voltage ramp such as curve 54 of FIG. 4 to the zener diode's terminations in a reverse bias direction. The voltage source was current limited to approximately 100 milliamps. This produces the flat portion of curve 38 at the far right. Clearly, this programming technique is functional but quite slow for use in a production environment since roughly 30 seconds is required to complete the process. It is useful, however, for viewing the heating phenomenon associated with the programming process. More appropriate programming techniques for increased speed will be discussed later.

At present, the mechanism which allows the above alteration of the diode characteristics is not fully understood but a theory has been postulated. The present invention should not, however, be limited by the accuracy of this theory. The present theory is that as current is applied to the diode, the narrow grain boundry junction begins to heat resulting in the line of glowing light sources. Since the impurities are diffused into and throughout the polycrystalline material by bombarding the upper surface, a slightly higher concentration of impurities can be expected to be close to the upper surface of the diode decreasing as oxide layer 22 is approached. This causes a higher degree of conductivity near the upper surface of the diode. In addition, the substrate acts as a heat sink coupled to the lower surface of the diode. These factors act together to cause localized high temperature spots near the upper surface of diode 24 with temperature decreasing as the oxide layer is approached.

Figure 5:
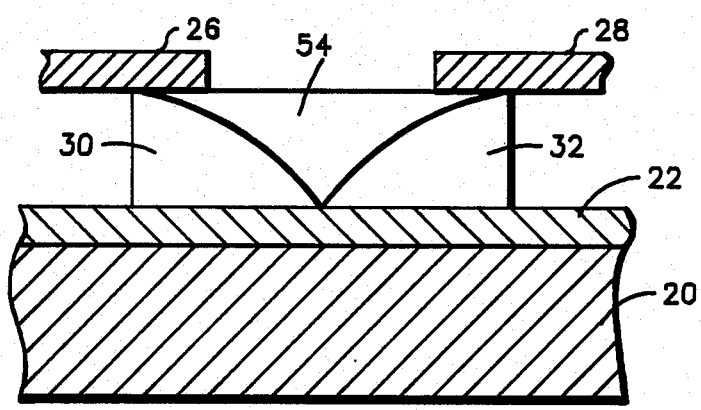
FIG. 5 shows a theoretical cross section of a lateral polysilicon diode which has been programed through the fourth stage of programming to the point of reversing polarity.

The localized high temperature spots at the upper surface of diode 24 near the junction 34 causes the polycrystalline silicon to begin to melt and then to recrystallize and become rather brittle. The melting stage of the polysilicon allows the impurities to become mobile and the P+ impurities are attracted to the cathode termination 28 while the N+ impurities are attracted to the anode termination 26. This tends to cause an electrical annealing and a rediffusion of the impurities resulting in impurities crossing the original P/N junction to form a new junction shown in exagerated form as junction 54 of FIG. 5. This also results in a crossover in impurities and a change in doping profile at the interface. In addition, the coarseness of the grain boundry is reduced. This new junction geometry results in a lowering of the zener knee due to increased junction area and increased doping near the terminals. In the limit, N+ impurities are believed to reach the termination 26 and P+ impurities are believed to reach termination 28 forming a reversed diode between those terminations. When the current is removed and the diode is allowed to cool, the polysilicon recrystallizes and the diffusion is permanent, stable and highly reliable since destruction of the diode and metalization was avoided. Furthermore, since the heating was restricted to near the surface of the polysilicon, little heating of the substrate takes place so that cracking and stress is avoided. The nonvolatile storage lifetime of this device appears to be nearly infinite, yet the process does allow for reversal of the programming process as will be discussed later.

This process actually causes the polycrystalline zener diode to take on characteristics more similar to those of a crystalline silicon diode. Thus, the programmed diode is a relatively high quality diode having low noise and and leakage ($I_s$ $10^{-12}$). It is clear to those skilled in the art that these characteristics are better than those of the original polycrystaline silicon diode.

For programming in the forward bias direction, the electrical potential induces a flow of impurities to the electrodes of the opposite potential which causes the junction interface to form a lower doping concentration diode structure. A similar melting and electrical annealing process takes place in the forward bias programming causing rediffusion and modification of the P/N junction. This in turn results in a zener knee which exhibits increased breakdown potential thus allowing arbitrary increasing of the zener knee under electrical control.

In both the forward and reverse programming processes the electrically induced migration of impurities is aided by the polysilicon grain boundry nature of the polysilicon material. Similar results may be attained with a polysilicon/silicon junction. In effect the present process induces an electrical annealing causing the polysilicon to become more like crystaline silicon. It is much more difficult to induce electrical migration in annealed material.

One of the more interesting features of the present invention is the programming stage which can be used as an analog memory. The programming of the device in the analog memory stage is rather device dependent and exists typically between approximately 9.5 and 10 volts when using voltage source ramp programming in the reverse bias programming mode. When programming in this stage with the goal of adjusting the zener knee to a particular level, the best approach appears to be to quickly ramping the programming voltage and monitoring the characteristics of the diode before the material begins to solidify. While the material is in the molten state, suitable measurements and adjustments may be made to the zener diode in either direction to achieve the desired zener knee voltage. After the material hardens, some readjustment may be made by repeating the process but this is less desirable. By maintaining the material in this molten state, suitable adjustments may be made until the desired voltage knee is achieved. However, the material cannot be held in the molten state indefinitely due to the changes taking place in the junction and the changing doping concentrations. In this particular stage of programming a practical limit of approximately 10 microseconds is probably the maximum time allowable to adjust the zener knee before the next programming stage as shown in FIG. 3 is entered. All adjustments should be made within this time limit for the present embodiment.

It should be noted that since the zener knee may be reliably programmed to an arbitrary voltage level between approximately one volt and thirty volts depending upon processing, the device can be used as an analog memory element which may be used to store a large number of bits per element by equating a digital word of an arbitrary number of bits to a particular voltage level. It should also be noted that the range of programmable voltages may be extended as necessary by simply adding as many diodes as necessary in series and programming accordingly. Similarly, diodes may be created back to back or serially depending upon the desired result. Forward and reverse diode stacking and combinations of forward and reverse stacking may be utilized to achieve any desired breakdown voltage within practical limits. Similarly, one skilled in the art will recognize the merged diode structures may be used to reduce area and form combination structures that reduce the number of metalized terminals.

While the present structure and programming mechanism results in a memory element which appears to have a near infinite non-volatile storage lifetime (assuming operation well below the currents required to begin electrical rediffusion as described above), it is interesting to note that the electrical diffusion process described above may be repeated or reversed in many instances. This is carried out by either repeating the process or reversing the polarity of the programming current and reapplying the current to the diode depending upon the desired effect. It is typically possible to repeat this process only once with the present structure.

It is believed that each time the diode is electrically rediffused, the polysilicon material is recrystallized into a harder and more brittle structure which no longer lends itself to this process reliably.

The present invention may also be utilized to select redundant circuits to improve yields in VLSI integrated circuits. The present invention is particularly advantageous for this application because it utilizes low currents and is compatible with many standard processes.

In many instances it may be desirable to directly program the zener to be a reversed diode as described above. Such is the case when the present invention is to be used as the binary memory element in a PROM or when used to select redundant circuits. It is desirable in this case to program the zener diodes more rapidly than described previously since there may be many such zeners on a single integrated circuit. This is particularly important in production environments where throughput should be maximized without sacrifice of reliability.

Figure 6:
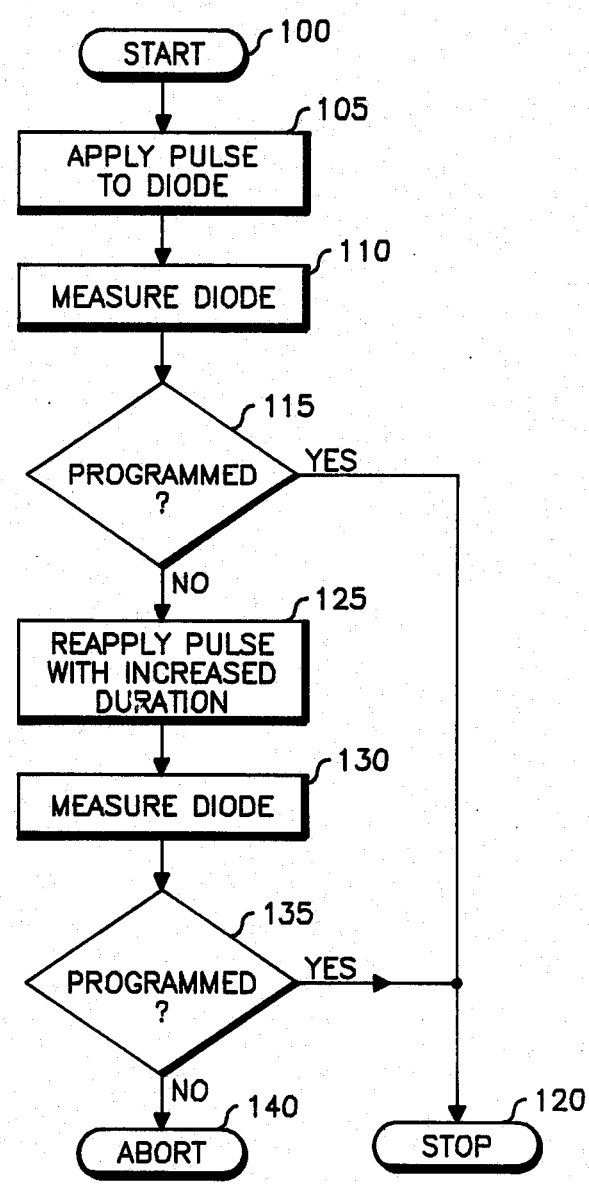
FIG. 6 shows a flow chart of the programming process of the present invention.

More rapid programming may be achieved by the process shown in FIG. 6. The process is started at block 100 and at step 105 a first programming attempt is made by applying a rectangular pulse of about 20 volts with a current source which is current limited to approximately 95 milliamps to the zener diode in the reverse bias direction for approximately 10.0 microseconds. At step 110 the diode is measured to determine the success of the programming process. Many methods for measuring the present diode will occur to those skilled in the art. A decision is made at step 115 depending on the success of step 105. If the programming was successful and a reversed diode has been created the process is stopped at step 120.

If step 105 is unsuccessful, a second electrical pulse of approximately 20 volts may be applied with an extended duration of approximately 20.0 microseconds at step 125. The zener diode is then tested again at step 130 to determine if programming was successful at step 130. Decision step 135 then stops the process at step 120 if step 125 was successful. If step 125 is unsuccessful the process is aborted at step 140 as further increases in programming time or current or voltage may successfully program the diode but result in an unreliable device. Many variations of this process will occur to those skilled in the art and it is understood that the particular times and signal levels may be inappropriate for zener geometries and processing parameters other than those disclosed. One skilled in the art will find that there are many methods which are suitable for programming the present device which will result in the electrical rediffusion and annealing which results in a high reliablilty programmed device.

The programming pulses described above may be used to program the zener diodes of the present invention by using standard PROM programmers. Commercial PROM programmmers such as the Motorola model DAC R-1800A PROM programmer or its equivalent may be used to program the zener diodes of the present invention by suitable modification to the programmer's software. The required software modifications may be readily implimented in light of the foregoing by one skilled in the art.

Both constant voltage and constant current techniques using pulsed, continuous and ramping techniques can be used. The programming mechanism and resulting state have been shown to be both a function of programming power and pulse duration. Using voltage source pulses of approximately 25 volts, programming durations of less than 1 microsecond (500 nanoseconds typical) can be attained. Speeds on this order are very desirable for programming large memories. Constant voltage (20 volts) variable length pulses can be used to achieve the various states described herein including the analog memory region. Perhaps the best programming technique for this device is a monitored continuously ramping voltage sourse technique using a rapid ramp. This provides the most reliable and consistent programming results due to processing variations of the device but may not be readily implemented with some standard commercial programmers.

It should be noted that a constant voltage programming source may be used to program the diode also and a transient pulse characteristic of this programming source has been observed to speed up the programming process and insure a change in states.

Figure 7:
FIG. 7 shows a graph of the programming limits of the process of the present invention with a lateral polysilicon diode.

Turning now to FIG. 7, a graph of the approximate limits of the programming process using the structure of FIG. 1 is shown. Curve 200 is the zener knee voltage of a typical unprogrammed lateral polysilicon diode as discussed above. Curve 205 shows the characteristics of the resulting forward diode obtained from reverse bias programming of the diode of curve 200. Curve 210 results from reverse bias programming of the diode of curve 200 to the limit.

Another interesting feature of the present diode is that the temperature charactistics are quite stable. Preliminary tests have indicated that the temperature coefficient (TC) approaches 0.0 PPM/degree Celcius +10 PPM/degree Celcius from −40 to +125 degrees Celcius when the unprogrammed diode is biased with approximately 100 microamps of reverse bias current. This data tends to indicate that potential exists for use of this device as a reference element in a voltage regulator or similar applications where a stable voltage reference is required. Furthermore, the temperature coefficient may be changed by changing the bias. For example, at 10 microamps the TC is approximately −2000 PPM/degree Celcius and at 1.0 microamps the TC is approximately −2500 PPM/degree Celcius. Above the 100 microamp bias level, positive TC's are observed. Combinations of forward and reversed diodes can be used to obtain a wide range of accuritely controllable TC's.

Thus it is apparent that in accordance with the present invention an apparatus that fully satisfies the objectives, aims and advantages is set forth above. While the invention has been described in conjunction with a specific embodiment, it is evident that many alternatives, modifications, and variations will become apparent to those skilled in the art in light of the foregoing description. Accordingly, it is intended that the present invention embrace all such alternatives, modifications and variations as fall within the spirit and broad scope of the appended claims.

What is claimed is:

1. A method of electrically altering the characteristics of a semiconductor device, said semiconductor device including a P type region made of intrinsic material doped with P type impurities and an N type region made of N type material doped with N type impurities forming a P/N junction having a zener knee voltage associated therewith, said P type region being coupled to a first terminal and said N type region being coupled to a second terminal and wherein at least one of sid regions is made of polycrystalline material, said method comprising the step of:

applying a forward bias electrical potential across said P/N junction, wherein said electrical potential is suitable for inducing a migration of P type impurities and N type impurities and altering the geometry and doping profile of said P/N junction, thereby causing said zener knee voltage to increase, and wherein said electrical potential is of a magnitude lower than that required to melt or otherwise significantly alter said termainls.

2. The method of claim 1, further including the step of reversing the polarity of the electrical potential to induce movement of said zener knee in the opposite direction of the original movement.

3. The method of claim 1, wherein said step of applying an electrical potential includes the step of applying a positive voltage ramp signal.

4. The method of claim 1, wherein said step of applying an electrical potential includes the step of applying a current pulse.

5. The method of claim 4, further including the step of measuring the voltage drop across the junction following the step of applying a current pulse.

6. The method of claim 5, further including the step of applying another current pulse if a desired voltage drop across the junction is not measured in the measuring step.

7. The method of claim 6, further including the steps of repeating the steps of measuring and applying until the desired voltage drop across the junction is achieved.

* * * * *